United States Patent
Test et al.

(10) Patent No.: US 7,217,656 B2
(45) Date of Patent: May 15, 2007

(54) STRUCTURE AND METHOD FOR BOND PADS OF COPPER-METALLIZED INTEGRATED CIRCUITS

(75) Inventors: Howard R. Test, Plano, TX (US); Donald C. Abbott, Norton, MA (US)

(73) Assignee: Texas Instruments Incorporated, Dallas, TX (US)

( * ) Notice: Subject to any disclaimer, the term of this patent is extended or adjusted under 35 U.S.C. 154(b) by 120 days.

(21) Appl. No.: 11/140,770

(22) Filed: May 31, 2005

(65) Prior Publication Data

US 2006/0267203 A1    Nov. 30, 2006

(51) Int. Cl.
*H01L 21/44* (2006.01)
(52) U.S. Cl. .................. 438/653; 438/654; 438/531; 438/944; 257/762; 257/751
(58) Field of Classification Search .................. 438/653
See application file for complete search history.

(56) References Cited

U.S. PATENT DOCUMENTS

2003/0060041 A1* 3/2003 Datta et al. .................. 438/652

* cited by examiner

*Primary Examiner*—Tu-Tu Ho
(74) *Attorney, Agent, or Firm*—Yingsheng Tung; Wade James Brady, III; Frederick J. Telecky, Jr.

(57) ABSTRACT

A metal structure for a contact pad of a wafer or substrate (101), which have copper interconnecting traces (102) surrounded by a barrier metal layer (103). The wafer or substrate is protected by an insulating overcoat (104). In the structure, the barrier metal layer is selectively exposed by a window (110) in the insulating overcoat. A layer of copper (105), adherent to the barrier metal, conformally covers the exposed barrier metal. Preferably, the copper layer is deposited by sputtering using a shadow mask. A layer of nickel (106) is adherent to the copper layer and a layer of noble metal (106) is adherent to the nickel layer. The noble metal may be palladium, or gold, or a palladium layer with an outermost gold layer. Preferably, the nickel and noble metal layers are deposited by electroless plating.

12 Claims, 3 Drawing Sheets

STRUCTURE AND METHOD FOR BOND PADS OF COPPER-METALLIZED INTEGRATED CIRCUITS

FIELD OF THE INVENTION

The present invention is related in general to the field of metallurgical systems with application to electronic systems and semiconductor devices and more specifically to structure and methods for integrated circuit contact pads bondable by ball bonding techniques.

DESCRIPTION OF THE RELATED ART

It is a continuing trend in the semiconductor industry to miniaturize integrated circuits (ICs). As a consequence of this trend, the RC time constant of the interconnection between active circuit elements increasingly dominates the achievable IC speed-power product. Consequently, there is a strong need to replace the relatively high impedance of the interconnecting aluminum metallization by the lower impedance of metals such as copper.

For IC bond pads made of copper, the formation of thin copper(I)oxide films during the manufacturing process flow severely inhibits reliable attachment of bonding wires, especially for conventional gold-wire ball bonding. In contrast to aluminum oxide films overlying metallic aluminum, copper oxide films overlying metallic copper cannot easily be broken by a combination of thermo-compression and ultrasonic energy applied in the bonding process. As further difficulty, bare copper bond pads are susceptible to corrosion.

In order to overcome these problems, the industry favors a process, in which a layer of aluminum is formed as a cap over the copper bond pad; this process re-constructs in principle the traditional situation of an aluminum pad, for which the conventional gold-wire ball bonding is well controlled. This process, though, has a number of drawbacks such as added cost and the risk of inadvertent scratching or smearing of the aluminum, causing electrical shorts.

Alternative processes based on the concept of depositing one or more layers on the copper, which are reliably bondable, have until now ran into technical problems, such as insufficient adhesion among the various metal layers and insulating materials, or unexpected corrosion and chemical undercuts.

SUMMARY OF THE INVENTION

Applicants recognize a need for a straightforward solution to create a metallurgical bond pad structure suitable for ICs having copper interconnection metallization, which combines a low-cost method of fabricating the bond pad structure with high reliability in operating the structure, in particular with reduced possibility of delamination and corrosion. It is a technical advantage that the bond pad structure and the method of fabrication are flexible enough to be applied for different IC product families and a wide spectrum of design and process variations. Preferably, these innovations should be accomplished while shortening production cycle time and increasing throughput and yield, and without the need of expensive additional manufacturing equipment.

One embodiment of the invention is a metal structure for a contact pad of a substrate having copper interconnecting traces surrounded by a barrier metal layer, wherein the substrate is protected by an insulating overcoat. In the structure, the barrier metal layer is selectively exposed by a window in the insulating overcoat. A layer of copper, adherent to the barrier metal, conformally covers the exposed barrier metal. A layer of nickel is adherent to the copper layer and a layer of noble metal is adherent to the nickel layer. The noble metal may be palladium, or gold, or a palladium layer followed by a gold layer.

Another embodiment of the invention is a method for fabricating a metal structure for a contact pad of a substrate having copper interconnecting traces surrounded by a barrier metal layer, wherein the substrate is protected by an insulating overcoat. First, a window is opened in the insulating overcoat to selectively expose the barrier metal layer. A shadow mask is then provided, which has an opening matching the contours of the window; the mask has a weak adhesive on one surface. The mask is aligned with the substrate so that said the opening is aligned with the overcoat window. The adhesive mask surface is brought in contact with the overcoat. A layer of copper is then deposited on the barrier metal layer, preferably by a sputtering technique; thereafter, the shadow mask is removed. A layer of nickel is deposited on the copper layer, preferably by an electroless plating technique. Finally, a layer of noble metal is deposited on the nickel layer, preferably by electroless plating.

Embodiments of the present invention are related to wire-bonded IC assemblies, semiconductor device packages, surface mount and chip-scale packages. It is a technical advantage that the invention offers a low-cost method of sealing the bond pad against moisture and delamination, and thus for protecting the integrated circuit against corrosion and stress-related contact failure. It is an additional technical advantage that the invention offers a methodology to smooth, stable interfaces of the gold wire ball and the modified bond pad, resulting in welds with strong metallic interdiffusion. Further technical advantages include the opportunity to scale the assembly to smaller dimensions, supporting the ongoing trend of IC miniaturization; and the absence of unwanted metals, supporting high reliability of the finished IC assemblies.

The technical advantages represented by certain embodiments of the invention will become apparent from the following description of the preferred embodiments of the invention, when considered in conjunction with the accompanying drawings and the novel features set forth in the appended claims.

BRIEF DESCRIPTION OF THE DRAWINGS

FIGS. 2 to 6B are schematic cross sections illustrating certain steps of the process flow for completing the fabrication of a bond pad on an integrated circuit wafer.

FIG. 2 depicts the opening of a window in the insulating overcoat to expose a portion of the interconnecting traces.

FIG. 3 depicts the alignment and attachment of a shadow mask matching the contours of the window.

FIG. 6B is the deposition of a noble metal layer on the nickel layer of FIG. 5B.

DETAILED DESCRIPTION OF THE PREFERRED EMBODIMENTS

Figure 1:
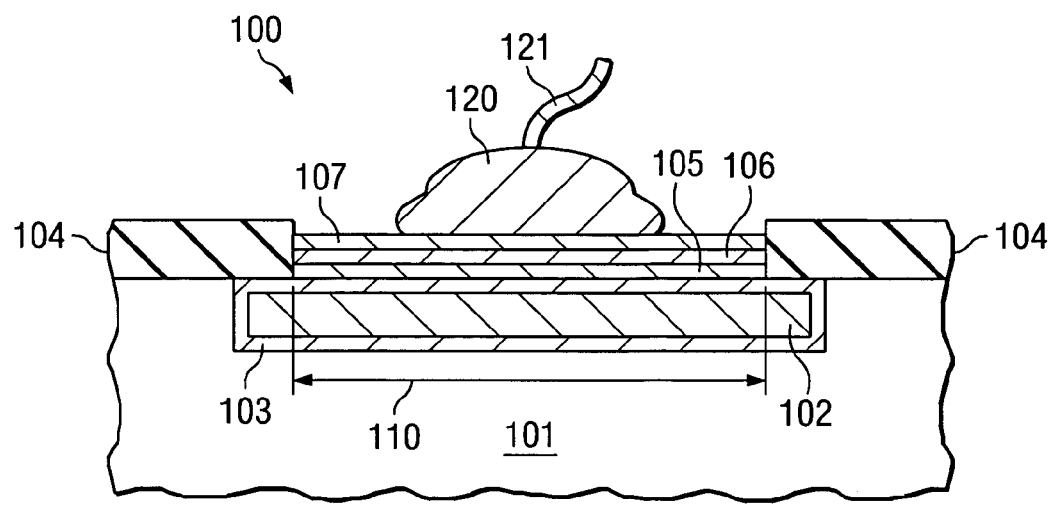
FIG. 1 is a schematic cross section of a bonded contact pad illustrating a preferred embodiment of the invention.

The schematic cross section of FIG. 1 illustrates a bond pad generally designated 100 of a semiconductor device, completed according to the process flow of the invention and with a wire bond attached. A substrate 101 has interconnecting traces 102 made of copper. Substrate 101 may be an integrated circuit formed in a semiconductor material, or it may be a supporting board. For an integrated circuit, copper trace 102 has preferably a thickness in the range from about 0.2 to 1.0 µm. In order to prevent outdiffusion of the copper, trace 102 is preferably surrounded by a barrier metal layer 103. Barrier metal layer 103 is typically tantalum nitride in the thickness range from about 20 to 50 nm. Substrate 101 is protected by an insulating overcoat 104, typically made of silicon nitride, silicon oxynitride, silicon carbide, or stacks of these or related insulators; a preferred thickness range is from about 0.5 to 1.0 µm.

As FIG. 1 shows, the barrier metal layer 103 of the copper trace 102 is selectively exposed by the window 110 in the insulting overcoat 104. Adherent to the exposed barrier metal layer 103 is a layer 105 of copper, which is preferably in the thickness range from about 0.2 to 0.5 µm. Adherent to copper layer 105 is a layer 106 of nickel, which is preferably in the thickness range from about 0.2 to 0.5 µm. Adherent to nickel layer 106 is a layer 107 of noble metal. Preferably this noble metal is palladium in the thickness range from about 100 to 300 nm. Alternatively, it may be gold about 50 to 120 nm thick, or it may be a stack of a palladium layer with an outermost layer of gold.

Layer 107 of noble metal is bondable by wire ball bonding. FIG. 1 shows a typical ball 120 formed of wire 121 and welded to noble metal layer 107, preferably by an automated and commercially available wire bonder.

Other embodiments of the invention address different bond pad configurations. As an example, copper trace 102 may have the barrier metal layer 103 removed across the width of window opening 110, after the window has been opened. In such device, a layer of refractory metal is deposited onto the copper of the interconnecting trace so that it adheres to the copper trace. Examples of refractory metals are titanium, tungsten, chromium, molybdenum, or alloys thereof; other examples include stacks of these metals or alloys. The preferred thickness range is from about 0.1 to 0.3 µm. In some embodiments, a refractory metal layer may even be deposited onto the existing barrier metal layer as an additional adherent layer.

Figure 2:
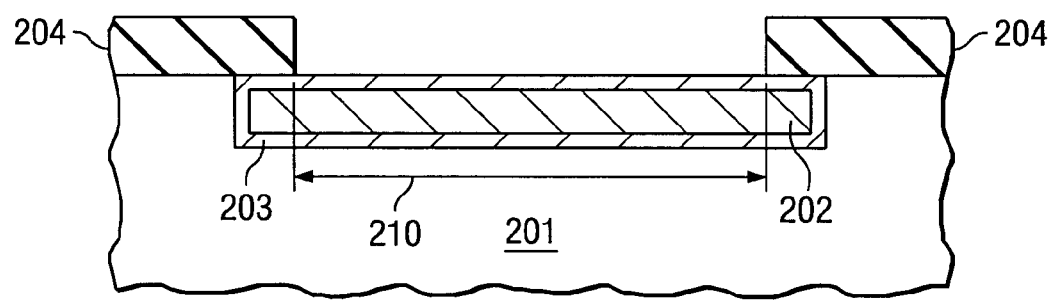

Another embodiment of the invention is a method for completing a metal structure for a contact pad of a substrate, which has interconnecting traces of copper surrounded by a barrier metal layer. Certain process steps are illustrated in the schematic cross sections of FIGS. 2 to 6B. In FIG. 2, the substrate is designated 201 and the copper trace 202. A barrier metal layer 203 surrounds copper trace 202. A preferred barrier metal is tantalum nitride. An insulating overcoat 204 protects the surface of substrate 201 and metal trace 202. A preferred overcoat material is silicon nitride or silicon oxynitride.

The process flow starts by opening a window of width 210 in overcoat 204 to expose a portion of the metallization trace. In the device of FIG. 2, the metal actually exposed is the barrier metal (for example, tantalum nitride); in other devices, it is the copper of the trace. In the next process step, depicted in FIG. 3, a shadow mask 301 is provided, which has an opening 310 matching the contours 210 of the window in the overcoat. Mask 301 has an adhesive 302 on one surface 301a; adhesive 302 is weak so that mask 301 adheres safely to overcoat 204 during the process steps in the vacuum chamber, but after the vacuum operation, the adhesive offers little resistance to peeling off mask 301 from overcoat 204. Shadow masks are stamped from metal foil (typically aluminum), are inexpensive and may be disposable or re-usable.

Figure 3:
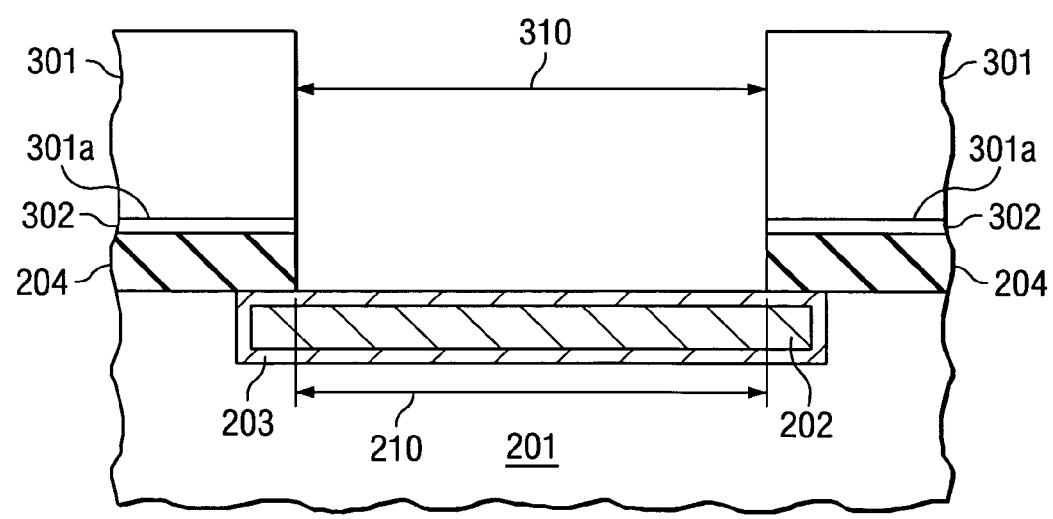

Shadow mask 301 is aligned with the overcoat window so that the mask opening 310 is aligned with the overcoat window 210. The weak adhesive 302 on mask surface 301a is then brought in contact with the overcoat 204. The resulting arrangement, illustrated in FIG. 3, is transferred into a vacuum chamber for sputter depositing metal layers.

Figure 4A:
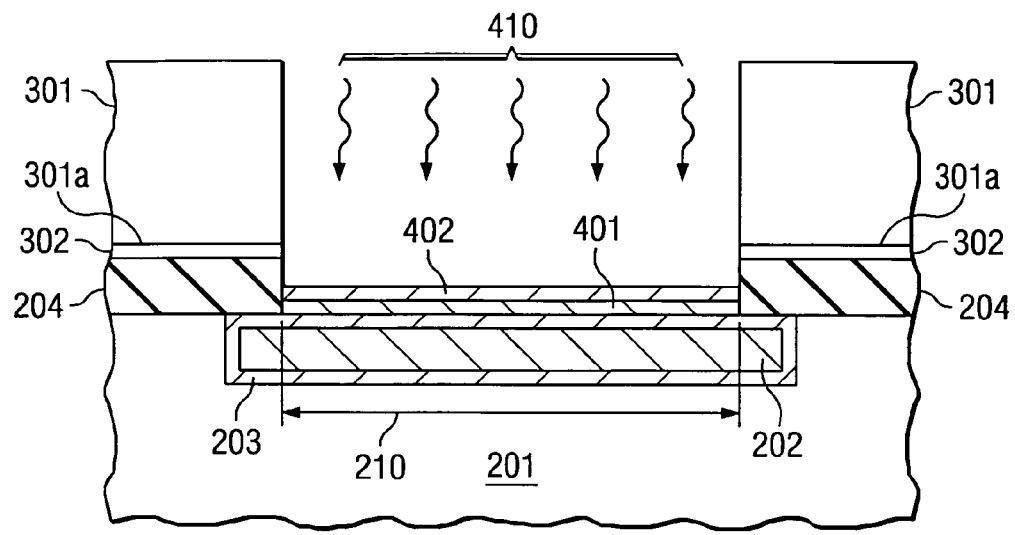
FIG. 4A depicts the plasma deposition of a copper layer on the exposed trace.
Figure 4B:
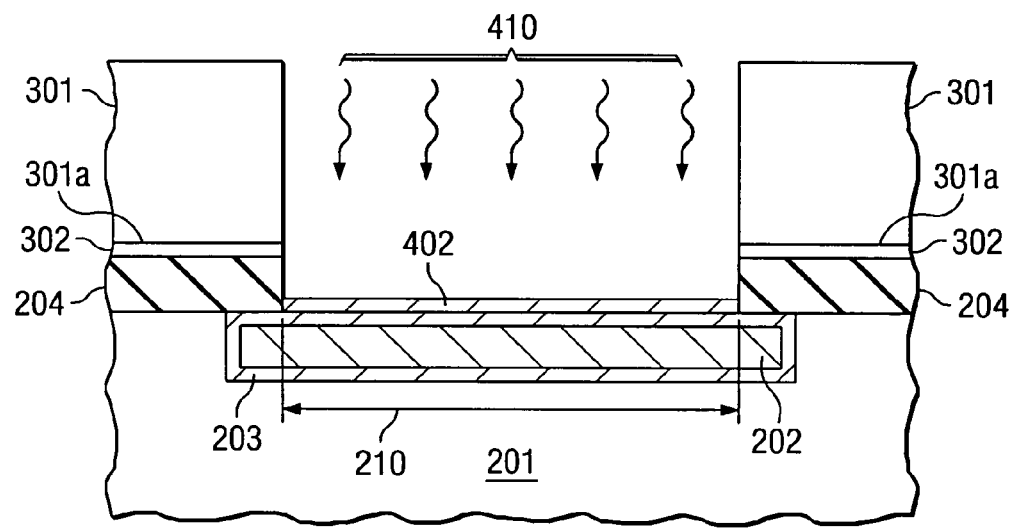
FIG. 4B depicts the plasma depositions of a refractory metal layer and a copper layer on the exposed trace.

FIGS. 4A and 4B indicate plasma processes 410 in the vacuum chamber. First, the surface of the exposed trace may be cleaned by subjected it for a short period of time to a plasma of inert gases such as argon or nitrogen. Without breaking the vacuum of the chamber, the sputter deposition of refractory metal layer 401 is then initiated, as indicated in FIG. 4A (the simultaneously deposited refractory metal on top of mask 301 is not shown in FIG. 4A). Refractory metal layer 401 has a preferred thickness range from about 0.1 to 0.3 µm. It may be selected from a group of refractory metals and alloys; a preferred selection is an alloy of titanium and tungsten in a mixture of about equal amounts. Alternative choices include chromium, molybdenum, alloys of these and other refractory metals, or stacks of refractory metal layers. Layer 401 is required, when the barrier metal layer 203 is missing on the exposed surface of copper trance 202; layer 401 may be omitted, when barrier layer is present on the surface of copper trace 202, as shown in FIG. 4B.

Without breaking the vacuum, a layer 402 of copper is then sputtered on the refractory metal 401 (FIG. 4A), or on the barrier metal 203 (FIG. 4B). The copper is adherent to the metal layer underneath. The preferred thickness range for the copper layer is between about 0.2 to 0.5 µm.

After the sputter deposition of the copper layer, the wafer is taken from the vacuum chamber and shadow mask 301 is removed from the wafer. The mask may be used only one time and then disposed, or it may be cleaned for re-use. In addition, the wafer surface may be cleaned to remove any residual adhesive.

Figure 5A:
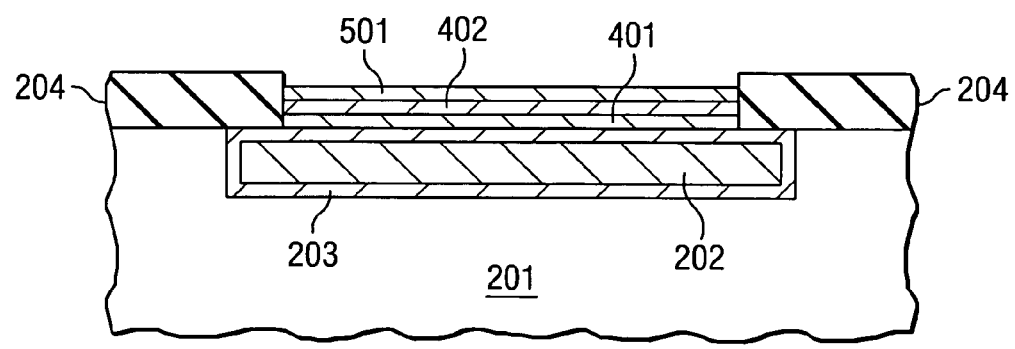
FIG. 5A depicts the deposition of a nickel layer on the copper layer of FIG. 4A.
Figure 5B:
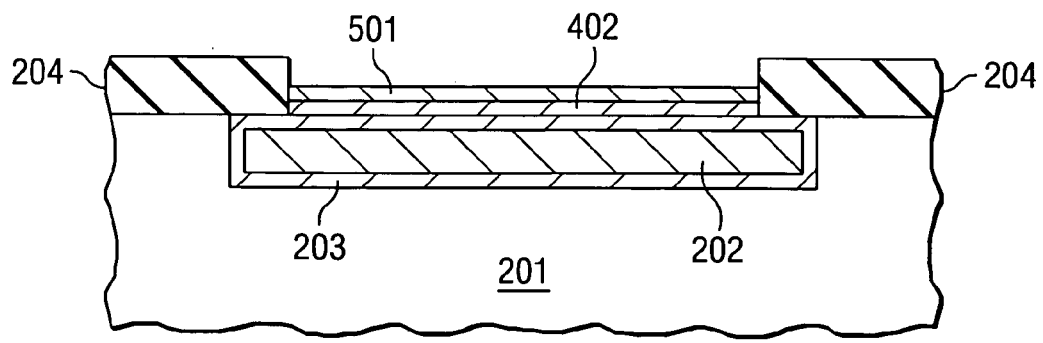
FIG. 5B depicts the deposition of a nickel layer on the copper layer of FIG. 4B.
Figure 6A:
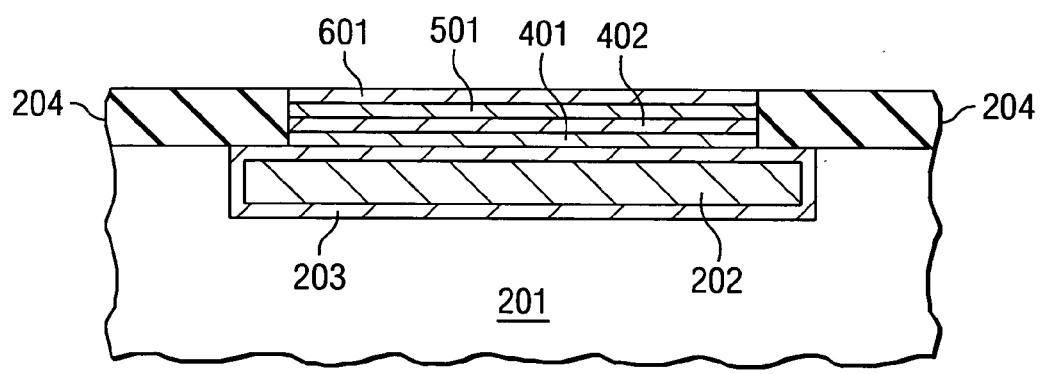
FIG. 6A is the deposition of a noble metal layer on the nickel layer of FIG. 5A.
Figure 6B:
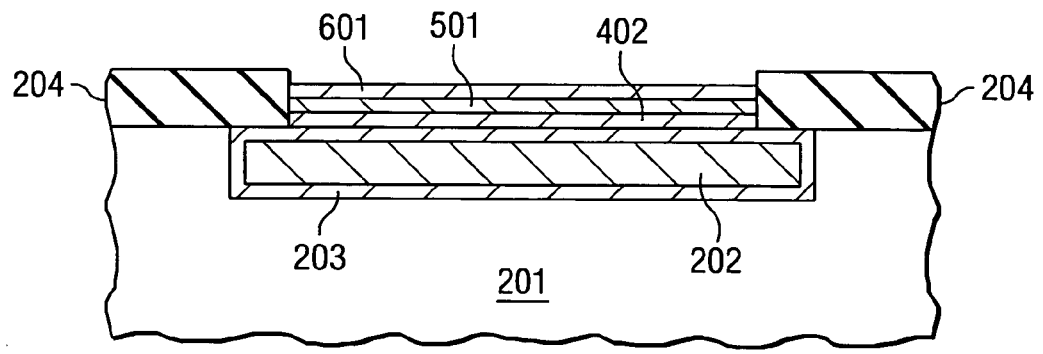

The deposition of the additional metal layers for completing the bond pad structure is performed using an electroless plating technique. In FIGS. 5A and 5B, a nickel layer 501 is (electroless) plated on the pristine copper layer 402. Nickel layer 501 is adherent to the pristine copper layer 402 and is preferably between about 0.2 and 0.5 µm thick.

Finally, a layer 601 of noble metal is (electroless) plated on nickel layer 501. Preferably, noble metal layer is made of palladium in the thickness range from about 100 to 300 nm. In many embodiments, though, an additional gold layer in the thickness range from about 50 to 120 nm is (electroless) plated on top of the palladium layer to form the outermost layer of the structure. In either case, the noble metal layer 601 adheres well to the underlying nickel layer 501.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description.

As an example, the embodiments are effective in semiconductor wafers as well as in substrates, which have copper interconnecting metallization yet need to be bondable using conventional ball or ribbon bonding. As another example, the material of the semiconductor material may comprise silicon, silicon germanium, gallium arsenide, or any other semiconductor or compound material used in IC manufacturing. As yet another example, the concept of the invention is effective for many semiconductor device technology nodes and not restricted to a particular one. It is therefore intended that the appended claims encompass any such modifications or embodiments.

We claim:

1. A method for completing a metal structure for a contact pad of a substrate having interconnecting traces of copper surrounded by a barrier metal layer, said substrate protected by an insulating overcoat, comprising the steps of:

opening a window in said insulating overcoat to expose a portion of said interconnecting trace;

providing a shadow mask having an opening matching the contours of said window, said mask having a layer of adhesive material on one surface;

aligning said mask with said substrate so that said mask opening is aligned with said overcoat window;

bringing said adhesive mask surface in contact with said overcoat;

depositing a layer of copper on said exposed portion of said interconnecting trace;

removing said shadow mask;

depositing a layer of nickel on said copper layer; and depositing a layer of noble metal on said nickel layer.

2. The method according to claim 1 wherein said shadow mask is a stamped metal mask selected for single-time usage.

3. The method according to claim 1 further comprising the step of depositing a layer of refractory metal on said exposed portion of said interconnecting trace, followed by said step of depositing a layer of copper.

4. The method according to claim 1 wherein said step of depositing said layer of copper comprises a sputtering technique.

5. The method according to claim 3 wherein said step of depositing said layer of refractory metal comprises a sputtering technique.

6. The method according to claim 1 wherein said steps of depositing said layer of nickel and said layer of noble metal comprise an electroless plating technique.

7. The method according to claim 1 further comprising the step of cleaning said overcoat surface to remove any residual adhesive after said step of removing said shadow mask.

8. The method according to claim 1 wherein said noble metal is palladium.

9. The method according to claim 1 wherein said noble metal is gold.

10. The method according to claim 1 wherein said step of depositing a noble metal comprises first a step of depositing a layer of palladium on said nickel layer and then a step of depositing a layer of gold on said palladium layer.

11. A method for completing a metal structure for a contact pad of a substrate having interconnecting traces of copper surrounded by a barrier metal layer, said substrate protected by an insulating overcoat, comprising the steps of:

opening a window in said insulating overcoat to expose a portion of said interconnecting trace;

providing a shadow mask having an opening matching the contours of said window, said mask having a layer of adhesive material on one surface;

aligning said mask with said substrate so that said mask opening is aligned with said overcoat window;

bringing said adhesive mask surface in contact with said overcoat;

sputter-depositing a layer of refractory metal on said exposed portion of said interconnecting trace;

sputter-depositing a layer of copper on said refractory metal layer; and removing said shadow mask.

12. The method according to claim 11 further comprising the step of depositing at least one layer of bondable metal on said pristine copper layer.

* * * * *